US010826291B2

(12) United States Patent
Xavier

(10) Patent No.: US 10,826,291 B2
(45) Date of Patent: Nov. 3, 2020

(54) ELECTROSTATIC DISCHARGE TRANSIENT POWER CLAMP

(71) Applicant: Coolstar Technology, Inc., Santa Clara, CA (US)

(72) Inventor: Jessel T. Xavier, Sunnyvale, CA (US)

(73) Assignee: COOLSTAR TECHNOLOGY, INC., Santa Clara, CA (US)

( * ) Notice: Subject to any disclaimer, the term of this patent is extended or adjusted under 35 U.S.C. 154(b) by 281 days.

(21) Appl. No.: 16/128,676

(22) Filed: Sep. 12, 2018

(65) Prior Publication Data

US 2020/0083705 A1    Mar. 12, 2020

(51) Int. Cl.
*H02H 9/04* (2006.01)
*H01L 27/02* (2006.01)

(52) U.S. Cl.
CPC ......... *H02H 9/046* (2013.01); *H01L 27/0285* (2013.01)

(58) Field of Classification Search
CPC ............................. H02H 9/046; H01L 27/0285
See application file for complete search history.

(56) References Cited

U.S. PATENT DOCUMENTS

| | | | |
|---|---|---|---|
| 5,255,146 A | 10/1993 | Miller | |
| 5,946,177 A * | 8/1999 | Miller | H01L 27/0248 361/56 |
| 5,973,897 A | 10/1999 | Opris et al. | |
| 9,166,402 B2 * | 10/2015 | Schulmeyer | H02H 9/046 |
| 2007/0247772 A1 | 10/2007 | Keppens et al. | |
| 2011/0261489 A1 * | 10/2011 | Zupcau | H01L 27/0296 361/56 |
| 2011/0286136 A1 | 11/2011 | Tsai | |
| 2012/0180008 A1 * | 7/2012 | Gist, III | H01L 27/0285 716/101 |
| 2013/0182357 A1 | 7/2013 | Brodsky | |
| 2016/0172850 A1 * | 6/2016 | Ellis-Monaghan | H02H 9/046 361/56 |
| 2017/0098935 A1 * | 4/2017 | Tseng | H02H 9/046 |
| 2017/0229444 A1 * | 8/2017 | Torres | H01L 27/0266 |

* cited by examiner

*Primary Examiner* — Scott Bauer
(74) *Attorney, Agent, or Firm* — Hoffman & Baron, LLP

(57) ABSTRACT

An ESD power clamp circuit includes first, second and third timing networks, first and second NMOS transistors and an enable circuit. The first timing network has a first time constant and detects a voltage transient between first and second voltage supply nodes having a rise time less than the first time constant. The first NMOS transistor has a gate connected with an output of the first timing network and a source connected with a gate of the second NMOS transistor. The second NMOS transistor has a drain connected with the first voltage supply node and a source connected with the second voltage supply node. The second timing network is coupled with the gate of the second NMOS transistor and has a second time constant that is greater than a duration of an ESD event. The third timing network is coupled with the enable circuit and has a third time constant, the third timing network generating a first control signal based on the third time constant. The enable circuit inhibits clamping action of the clamp circuit based on the first control signal.

25 Claims, 7 Drawing Sheets

FIG. 1 *(PRIOR ART)*
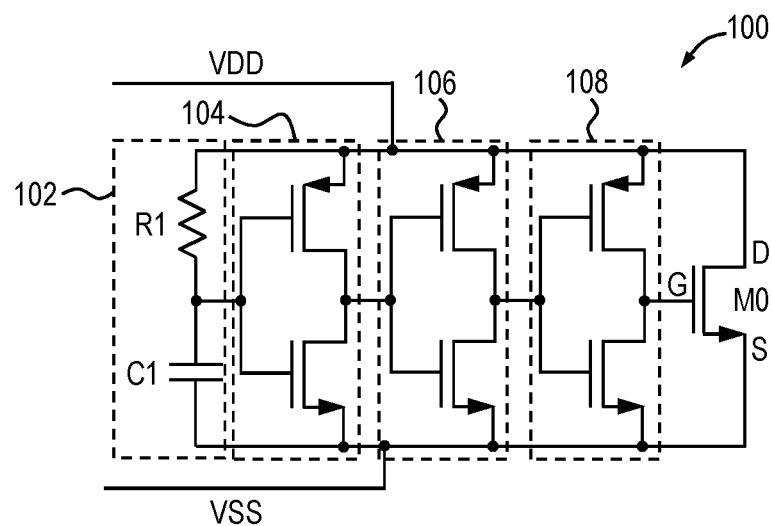
FIG. 2
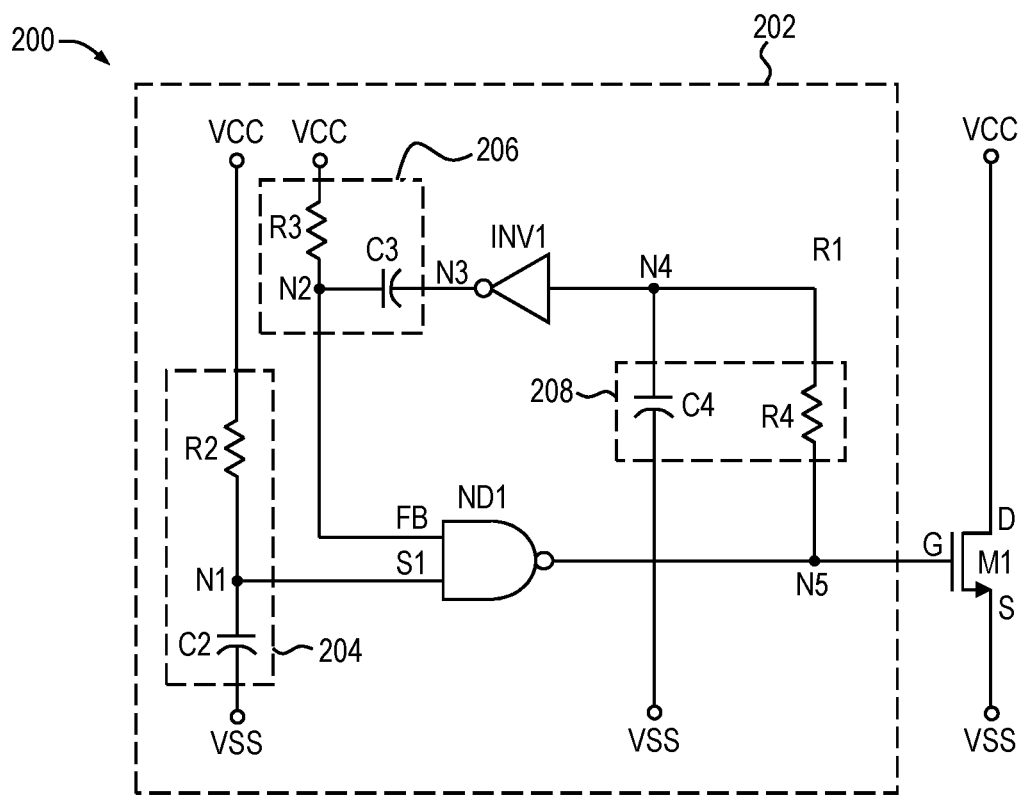

ELECTROSTATIC DISCHARGE TRANSIENT POWER CLAMP

FIELD

The present invention relates generally to the electrical, electronic and computer arts, and, more particularly, to electrostatic discharge protection in an integrated circuit.

BACKGROUND

Electrostatic discharge (ESD) during assembly and handling is a major cause of damage to integrated circuits (IC). An ESD event involves charge transfer between the device and an external body due to electrostatic potential difference. During an ESD event, large currents can pass through the pins of an IC for very short durations of time causing electrical and thermal overstress and resulting internal damage. Such internal damage can wholly or partly impair the functionality of the device or its operational lifetime. ESD sensitivity testing is in wide use for quantifying susceptibility of devices to damage in various environments. Such tests emulate ESD events in a controlled fashion by subjecting the device under test to transient electrical overstress for various discharge pathways. Hence, building ESD protection into electronic devices and establishing its efficacy through sensitivity testing has become a routine part of the product development process.

For ESD protecting integrated circuits, various protection elements are added to augment core circuitry in the IC device. A widely used method of ESD protection employs a power clamp coupled between positive and negative supply nodes in combination with individual protection elements to provide bidirectional discharge paths between each of the pins and one or more of the voltage supply nodes. A discharge path in effect diverts large discharge currents away from vulnerable internal circuitry. For this to be effective, the discharge path must be fast acting and be of sufficiently low impedance so that the terminal voltage is limited to a tolerable level during the ESD event.

Power clamps can generally be classified as static or transient according to their manner of operation. A static clamp limits voltage rise by conducting when the terminal voltage exceeds a predetermined level. Such clamps are often set to a threshold level higher than the specified absolute maximum power supply voltage with the addition of an adequate margin to avoid false activation during normal operation. Thus, terminal voltage can reach well in excess of the maximum rated supply voltage during an ESD event, which often limits the utility of static clamps. Further, as in the case of diode-based static clamps, resistive voltage drops from large discharge currents will cause the terminal voltage to reach even higher levels than the threshold, thereby exacerbating the problem.

Alternatively, a transient clamp dynamically turns on during a voltage surge arising from discharge events. A resistor-capacitor (RC) trigger circuit is typically employed for detecting fast transients and in turn switching on a large-sized transistor that bypasses discharge currents. This method is effective in limiting the voltage rise during ESD events to a few volts and is widely adopted in complementary metal-oxide-semiconductor (CMOS) circuits.

A disadvantage of many conventional transient power clamps in IC devices is that they can potentially interfere with normal operation of the core circuitry. Such interferences include false activation during power-up and during operation after power-up. The potential for activation during power-up imposes restrictions on minimum power-up time. Low power-up time is important for applications requiring fast turn-on and turn-off capability. Interferences of the latter type arise from voltage transients caused by switching events or power ramping. In addition, power supply nodes can be significantly corrupted with operating frequency signals. These scenarios have the potential to activate the ESD trigger mechanism and turn on the main ESD element. As the main ESD element is typically a large device capable of drawing significant currents, false activation may lead to improper operation and/or damage depending on its duration and intensity. This problem is exacerbated at high frequencies (e.g., greater than about 10 MHz). Accordingly, an important design goal is to minimize interactions of the power clamp with the core circuitry while concurrently maximizing the level of ESD protection in the IC device.

Another disadvantage of many prior art transient power clamps is that they are realized using complementary metal-oxide-semiconductor (MOS) transistors. Such designs therefore cannot be used in technologies with lower voltage rated P-channel metal-oxide-semiconductor (PMOS) devices.

SUMMARY

Embodiments of the present invention beneficially provide a power clamp apparatus and methods for protecting core circuitry in an IC device from damage attributable to an ESD event. The ESD power clamp, according to one or more embodiments, is implemented without a need for P-channel metal-oxide-semiconductor (PMOS) devices, which, in certain high-voltage technologies, are not able to withstand the voltages at which N-channel metal-oxide-semiconductor (NMOS) devices in the power clamp operate. Advantageously, the unique circuit architecture of the power clamp according to one or more embodiments incorporates at least three independent timing networks which facilitates decoupling of the clamp engagement, clamp disengagement, and power-up detection aspects of operation. Another unique aspect of embodiments of the invention exploits the characteristic nature of discharge events to more accurately distinguish between an ESD event and a power-on event to thereby achieve sub-microsecond power-up times. In this manner, embodiments of the invention provide an enhanced power clamp for use in an ESD protection application which provides superior immunity to false triggering, decreased power-up time, the ability of operate from a high-voltage power rail, and decreased size, compared to conventional power clamps, among other benefits.

In accordance with an embodiment of the invention, an exemplary power clamp circuit suitable for use in an ESD protection application includes at least first, second and third independent timing networks, first and second NMOS transistors and an enable circuit. The first timing network is connected between first and second voltage supply nodes and has a first time constant associated therewith, the first timing network being configured to detect a voltage transient between the first and second voltage supply nodes having a rise time less than or equal to a value of the first time constant. The first NMOS transistor has a gate operatively coupled with an output of the first timing network and a source connected with a gate of the second NMOS transistor in a source follower configuration. The second NMOS transistor has a drain connected with the first voltage supply node and a source connected with the second voltage supply node. The second timing network is coupled with the gate of the second NMOS transistor, the second timing network having a second time constant associated therewith that is greater than an anticipated duration of the ESD event. The enable circuit is coupled with the first and/or second NMOS transistors and is configured to selectively inhibit clamping action of the power clamp circuit as a function of a first control signal supplied to the enable circuit. The third timing network is coupled with the enable circuit and has a third time constant associated therewith, the third timing network being configured to generate the first control signal as a function of the third time constant.

In accordance with another embodiment of the invention, an integrated circuit includes core circuitry and at least one transient power clamp circuit adapted to protect the core circuitry from damage attributable to an ESD event. The transient power clamp circuit includes a first timing network connected between first and second voltage supply nodes, the first timing network having a first time constant associated therewith and being configured to detect a voltage transient between the first and second voltage supply nodes that has a rise time less than or equal to a value of the first time constant. The power clamp circuit further includes at least first and second NMOS transistors, the first NMOS transistor having a gate operatively coupled with an output of the first timing network and having a source connected with a gate of the second NMOS transistor in a source follower configuration, the second NMOS transistor having a drain connected with the first voltage supply node and a source connected with the second voltage supply node. A second timing network in the power clamp circuit is coupled with the gate of the second NMOS transistor, the second timing network having a second time constant associated therewith that is greater than an anticipated duration of the ESD event. An enable circuit in the power clamp circuit is operatively coupled with at least one of the first and second NMOS transistors, the enable circuit being configured to selectively inhibit clamping action of the power clamp circuit as a function of a first control signal supplied to the enable circuit. The power clamp circuit further includes a third timing network coupled with the enable circuit, the third timing network having a third time constant associated therewith and being configured to generate the first control signal as a function of the third time constant.

As may be used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Various units, circuits, modules, or other components may be described herein as being "configured to" perform a particular task or tasks. In such contexts, the term "configured to" is intended to be construed broadly as a recitation of structure generally meaning "having circuitry that" performs the task or tasks during operation. As such, the unit/circuit/module/component can be configured to perform the subject task or tasks even when the unit/circuit/module/component/is not currently powered on. In general, circuitry that forms the structure corresponding to "configured to" may include hardware circuits and/or memory storing program instructions executable to implement the operation. Similarly, various units/circuits/modules/components may be described as performing a task or tasks, for convenience in the description. Such descriptions should be interpreted as including the phrase "configured to." Reciting a unit/circuit/module/component that is configured to perform one or more tasks is expressly intended not to invoke a 35 U.S.C. § 112, paragraph (f) interpretation for that unit/circuit/module/component.

Techniques according to embodiments of the present invention provide substantial beneficial technical effects. By way of example only and without limitation, one or more embodiments of the invention achieve one or more of the following, among other benefits:

facilitates operation from a high-voltage power supply rail;

provides enhanced immunity to false activation of the ESD clamp compared to conventional approaches;

requires reduced power-up time relative to conventional transient power clamps;

provides robust ESD protection in a small space, thereby reducing die size requirements.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 1 is a schematic diagram depicting a power clamp which may be modified for use in an ESD protection circuit;

FIG. 2 is a schematic diagram depicting another embodiment of a power clamp which may be modified for use in an ESD protection circuit;

Figure 3:
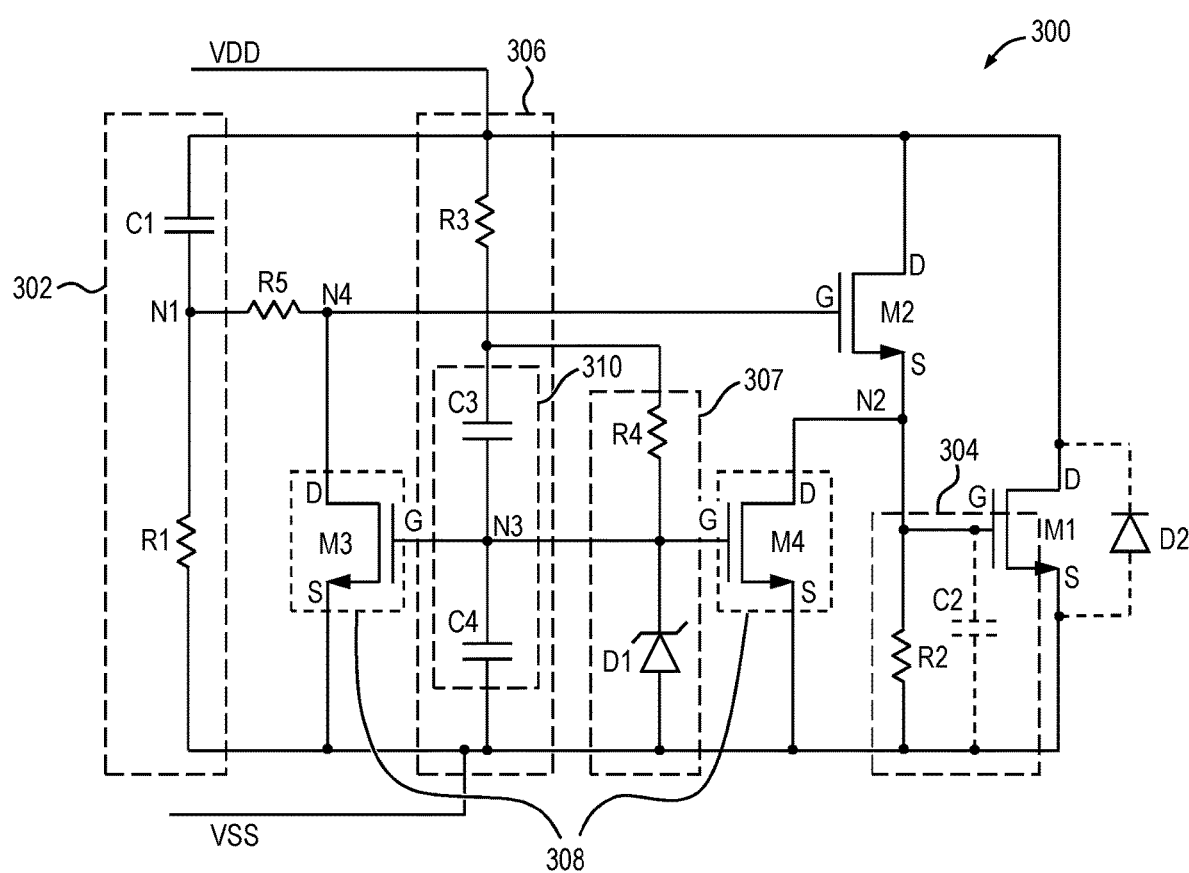
FIG. 3 is a schematic diagram depicting at least a portion of an illustrative transient ESD power clamp circuit for high-voltage radio frequency (RF) integrated circuits, in accordance with an embodiment of the present invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF PREFERRED EMBODIMENTS

Principles of the present invention will be described herein in the context of illustrative integrated electrostatic discharge (ESD) protection circuitry including a transient power clamp. It is to be appreciated, however, that the invention is not limited to the specific devices, circuits, systems and/or methods illustratively shown and described herein. Rather, aspects of the present disclosure relate more broadly to techniques for providing robust ESD protection for core circuitry in an IC device while reducing the likelihood of false triggering of the ESD protection mechanism and minimizing interference of the ESD protection mechanism with normal operation of the core circuitry. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

As previously stated, the occurrence of ESD during assembly and handling of electronic components is a major cause of failures in IC devices. Such failures may be detected during post-package testing, leading to a reduced yield. However, oftentimes an ESD event will cause a latent defect which is not detected but ultimately leads to premature failure of the device, and therefore reduced reliability. ESD sensitivity testing is widely used for quantifying the susceptibility of devices to damage in various environments. Such testing generally emulates ESD events in a controlled fashion by subjecting a device under test to transient electrical overstress for various discharge pathways. Hence, building ESD protection into electronic devices and establishing its efficacy through sensitivity testing has become a routine part of the product development process.

Depending on the polarity of an ESD event, the discharge current may likewise be positive or negative. Consequently, ESD protection mechanisms should effectively function for discharge currents of either polarity. One ESD protection method employs a power clamp coupled between positive and negative voltage supply nodes of an IC device, in combination with individual protection elements to provide bidirectional discharge paths between each IC pin and one or more of the supply nodes. A discharge path in effect diverts the large discharge currents present during an ESD event away from vulnerable core circuitry of the IC device. For this to be effective, the discharge path should be fast-acting and be of sufficiently low impedance so that the terminal voltage is clamped to a level which is tolerable to the core circuitry during the ESD event.

Standard ESD protection schemes employed in complementary metal-oxide-semiconductor (CMOS) circuits are implemented using complementary transistors; that is, N-channel metal-oxide-semiconductor (NMOS) and P-channel metal-oxide-semiconductor (PMOS) devices. However, in certain technologies used for high-voltage applications, complementary devices are not equally capable. For example, the PMOS transistor typically sustains a much lower voltage than the NMOS transistor. In fact, a drain-to-source breakdown voltage of the PMOS device can sometimes be lower than the normal operating supply voltage. This essentially precludes the use of PMOS devices in power clamps used for ESD protection.

FIG. 1 is a schematic diagram depicting an illustrative conventional power clamp circuit 100 which employs PMOS devices. The power clamp circuit 100 includes a resistor-capacitor (RC) timing circuit 102 which drives a main discharge device M0 through one or more cascaded inverter stages. The discharge device M0 is implemented as a large NMOS transistor device having a drain (D) connected to a positive voltage supply node, VDD, a source (S) connected to a negative voltage supply node, VSS, and a gate (G) connected to an output of the inverter stages.

In this power clamp circuit 100, three inverters are used to drive the discharge device M0, namely, a first inverter 104, a second inverter 106 and a third inverter 108, connected together in series. Specifically, an input of the first inverter 104 is connected to the RC timing circuit 102, an output of the first inverter is connected to an input of the second inverter 106, an output of the second inverter is connected to an input of the third inverter 108, and an output of the third inverter is connected to the main discharge device M0. The timing circuit 102 consists of a resistor, R1, and a capacitor, C1. A first terminal of R1 is connected to VDD, a second terminal of R1 is connected to a first terminal of capacitor C1, and a second terminal of C1 is connected to VSS.

A single timing network design involves making a tradeoff between false trigger immunity and engagement (i.e., activation) time. Employing multiple inverter stages in cascade helps balance these two requirements (i.e., false trigger immunity and ESD circuit activation time), however clamp circuits using multistage configurations are often prone to instability during operation and may require damping networks or other more sophisticated designs to suppress unwanted oscillation. Moreover, each of the inverter stages 104, 106, 108 in the power clamp circuit 100 uses complementary devices which, as previously explained, are unsuitable for technologies with low voltage PMOS devices that cannot withstand normal supply voltages at which the NMOS devices are operated. In consequence of using a single timing network, the power-up time of this circuit topology is undesirably high.

FIG. 2 is a schematic diagram depicting another illustrative power clamp circuit 200 for use as an ESD protection mechanism. The power clamp circuit 200 consists of an NMOS discharge device, M1, having a drain connected to a positive supply node, VCC, a source connected to the negative supply node VSS, and a gate connected to a trigger circuit 202. The trigger circuit 202 includes a first timing circuit 204, which is an RC circuit consisting of a first resistor, R2, connected between VCC and a first node N1, and a first capacitor, C2, connected between node N1 and VSS. A second timing circuit 206 in the trigger circuit 202 includes a second resistor, R3, connected between VCC and a second node N2, and a second capacitor, C3, connected between node N2 and a third node N3. A third timing circuit 208 in the trigger circuit 202 includes a third resistor, R4, connected between a fourth node N4 and a fifth node N5, and a third capacitor, C4, connected between node N4 and VSS. The trigger circuit 202 further includes an inverter, INV1, having an input connected to node N4 and an output connected to node N3, and a NAND gate, ND1, having a first input connected to node N1, a second input connected to node N2, and an output connected to the gate of the discharge device M1 at node N5.

The first timing circuit 204 is operative to detect voltage transients between the positive and negative voltage supply nodes VCC and VSS, respectively. A first time constant, Ti, corresponding to the first timing circuit 204 is low enough to ensure that only fast voltage transients are detected (e.g., about 35 nanoseconds (ns)). The second timing circuit 206 has a second time constant, $\tau_2$, associated therewith which is longer than the duration of an ESD event (e.g., about 2 microseconds (μs)), and the third timing circuit 208 has a third time constant, $\tau_3$, (e.g., about 7 ns) associated therewith which is longer enough to ensure that a false trigger of the ESD clamp is not latched. Any transient spanning less than about 7 ns is assumed not to be a legitimate ESD event, but rather noise. If the transient event is longer in duration than the third time constant $\tau_3$, as detected by the third timing circuit 208, the second timing circuit 206 is triggered, via a feedback loop comprising the inverter INV1 and the third timing circuit 208, to ensure that the discharge device M1 remains latched for the duration of the second time constant $\tau_2$. Thus, the first timing circuit 204 detects the ESD event, the third timing circuit 208 screens for an event long enough to be considered an ESD event, and the second timing circuit 206 ensures that the ESD discharge device remains turned on (i.e., latched) for the duration of the ESD event.

The power clamp circuit 200, however, has certain disadvantages that prevent its use with higher supply voltages, at least in part because internal gate voltages would be at the level of the supply voltage, which is too high as to cause device failure. Furthermore, the power clamp circuit 200, like the power clamp circuit 100 shown in FIG. 1, typically employs PMOS transistors, particularly to implement the inverter INV1 and NAND gate ND1, which are not able to withstand the higher voltages at which NMOS devices in the power clamp circuit can operate, as previously stated.

Aspects of the present invention, according to embodiments thereof, provide a unique power clamp circuit architecture for protecting core circuitry in an IC device from damage attributable to an ESD event. The ESD power clamp, according to one or more embodiments, incorporates at least three separate timing networks that facilitate independent control of clamp engagement, clamp disengagement, and power-up detection functions. In this manner, embodiments of the invention provide an enhanced power clamp for use in an ESD protection scheme which, compared to conventional power clamp architectures, provides superior immunity to false triggering, decreased power-up time, the ability to operate from a high-voltage power rail, and decreased size, among other features and advantages.

An important design aspect of a transient clamp circuit is the prevention of false activation under normal operation. If improperly implemented, the power clamp circuit may turn on, for example, during fast power-up of core circuitry being protected. In addition, power supply noise as well as supply node voltage spikes which may occur during normal operation (i.e., after power-up), also have the potential to activate the trigger and turn on the primary ESD discharge element. False activation may also occur as a result of something other than a triggered operation; for example, RF interference may cause the primary ESD discharge element to at least partially turn on. Since the ESD discharge element is typically a large transistor device capable of drawing substantial currents, such false activation can lead to improper operation or damage to the core circuitry, depending on the duration and intensity.

To reduce or eliminate false activation, one or more embodiments of the invention beneficially features an ability to distinguish between ESD events and power-on events. An ESD power clamp circuit according to one or more embodiments of the invention supports fast powering-up at least in part by distinguishing ESD events from turn-on transients spanning similar durations of time. This is accomplished, in one or more embodiments, by advantageously exploiting the nature of ESD events that are characterized by a fast rise followed by an exponential decay. Immunity to other spurious transients may be handled by effective disablement after powering up.

With reference now to FIG. 3, a schematic diagram depicts at least a portion of an exemplary transient ESD power clamp circuit 300 for protecting high-voltage RF integrated circuits, in accordance with an embodiment of the present invention. The illustrative power clamp circuit 300 includes a first timing network 302, which in this embodiment comprises an RC circuit, a second timing network 304, a third timing network 306 and a voltage regulator network 307. The ESD power clamp circuit 300 further includes a first NMOS transistor, M1, which functions as the primary ESD element, a second NMOS transistor, M2, which drives transistor M1, and a power clamp enable circuit 308, which in one or more embodiments comprises third and fourth NMOS transistors, M3 and M4, respectively. Hence, the ESD power clamp circuit 300 is implemented without a need for PMOS devices, which are not able to withstand the higher voltages at which NMOS devices in the power clamp circuit can operate, and is instead implemented exclusively with NMOS devices.

Specifically, the first timing network 302 comprises a first resistor, R1, having a first terminal connected with a negative voltage supply node, VSS, and a second terminal connected with an output node, N1, of the first timing network, and a first capacitor, C1, having a first terminal connected with a positive voltage supply node, VDD, and a second terminal connected with the output node N1. The second timing network 304 comprises a parallel RC circuit, including a second resistor, R2, having a first terminal connected to the gate terminal of the first transistor M1 at a node N2 and a second terminal connected with VSS, and a second capacitor, C2, having a first terminal coupled to the gate terminal of the first transistor M1 at node N2 and a second terminal connected with VSS. The capacitor C2, in this embodiment, represents a gate-to-source capacitance of the primary ESD element M1, although C2 may include other capacitance components as well, including a discrete capacitor (not explicitly shown, but implied). The third timing network 306 comprises a third resistor, R3, having a first terminal connected with VDD and having a second terminal connected with a first terminal of a third capacitor, C3, a second terminal of C3 being connected with an output node, N3, of the third timing network, and a fourth capacitor, C4, having a first terminal connected with the output node N3 and having a second terminal connected with VSS. Capacitors C3 and C4 form a capacitor voltage divider network 310 of the third timing network 306.

The voltage regulator network 307, in this exemplary embodiment, comprises a forth resistor, R4, having a first terminal connected with the first terminal of the third capacitor C3 and a second terminal connected with node N3, and a Zener diode D1 having a cathode connected with node N3 and an anode connected with VSS. It is to be appreciated that other voltage regulator arrangements are similarly contemplated by embodiments of the invention. Furthermore, since the presence of the voltage regulator network 307 functions primarily to protect the NMOS devices from damage, as necessitated by the use of a high-voltage power supply, in certain applications where the supply voltage is less than a prescribed maximum gate voltage of the NMOS devices in the power clamp circuit 300, the voltage regulator network may essentially be eliminated.

The primary ESD element M1, which preferably comprises a large NMOS device, has a drain (D) connected with VDD, a source (S) connected with VSS, and a gate (G) connected with the second timing network 304 at node N2. A diode, D2, which represents an intrinsic body diode associated with transistor M1, has a cathode connected with VDD and an anode connected with VSS. NMOS transistor M2, which drives the primary ESD element M1, has a drain connected with VDD, a source connected with the gate of M1 at node N2, and a gate connected with node N4. Node N4 is connected with the output node N1 of the first timing network 302 using a fifth resistor, R5, which functions as a current limiter. ESD driver transistor M2 is thus connected in a source follower arrangement. As previously stated, the power clamp enable circuit 308, in one or more embodiments, includes NMOS transistors M3 and M4, with a drain of M3 connected to node N4, which is linked to the output node N1 of the first timing network 302 via resistor R5, sources of M3 and M4 connected with VSS, a drain of M4 connected with node N2, and gates of M3 and M4 connected with the output node N3 of the third timing network 306.

The output node N3 of the third timing network 306 provides a control signal to enable circuit 308 which selectively enables and disables the power clamp circuit 300. During operation in a powered-up state, a positive voltage is present at the output node N3 of the third timing network 306 to turn on transistors M3 and M4 in the power clamp enable circuit 308. Specifically, when transistor M3 is turned on, node N4 is pulled to VSS, thereby disabling the driver transistor M1. Likewise, when transistor M4 is turned on, node N2 is pulled to VSS, thereby disabling the primary ESD element M1. In this manner, transistors M3 and M4 act in unison to disable the power clamp circuit 300 when its functionality is not required. When disabled, the power clamp circuit 300 presents a moderate capacitive impedance (e.g., about 3.2 pF) between its two terminals that are connected to VDD and VSS. The power clamp enable circuit 308, in one or more embodiments, serves to disable the power clamp circuit 300 after powering-up, and thus mitigates the problem of false activation from spurious transients and high-frequency signal coupling, and to reduce power-up time by distinguishing an ESD event from a turn-on event. In this manner, the ESD power clamp circuit 300 is beneficially capable of disabling itself, via the clamp enable circuit 308, after a prescribed time to prevent malfunction and/or damage resulting from a false trigger.

Each of the timing networks 302, 304 and 306 in the ESD power clamp circuit 300, with corresponding time constants $\tau_1$, $\tau_2$ and $\tau_3$, respectively, perform distinct functions; that is, the timing networks are essentially decoupled and operate independently from one another. In one or more embodiments, a value of the first time constant $\tau_1$ of the first timing network 302 is configured to be much smaller than a value of the second time constant $\tau_2$ of the second timing network 304, and a value of the third time constant $\tau_3$ of the third timing network 306 is configured to be less than the second time constant $\tau_2$ but higher than the first time constant $\tau_1$. In one or more embodiments, $\tau_3$ is about 200 ns, $\tau_2$ is about 8 times higher than $\tau_3$, and $\tau_1$ is about 7 times lower than $\tau_3$.

In terms of operation of the ESD power clamp circuit 300, the first timing network 302 preferably functions as a trigger, providing the gate voltage for controlling the driver device M2. The driver device M2 is coupled to the gate of the primary ESD element M1 in a source follower configuration, as previously described, which provides high current gain that allows the value of capacitor C1 to be reduced. This is because the driver device M2 is significantly smaller in size than the primary ESD element M1 and therefore does not appreciably load the RC trigger circuit (comprised of resistor R1 and capacitor C1) in the first timing network 302. Furthermore, this source follower arrangement of the driver device M2 provides an advantage of unilateral charge transfer, enabling charge supplied by the driver device M2 to hold the device M1 on for greater than about 1.5 μs after the driver device M2 has turned off. This can be contrasted with the use of inverter stages, as in many standard power clamps, where the inverter chain provides gain but does not provide unilateral charge transfer.

A second consideration which also favors a low value of capacitance for C1, in one or more embodiments, is that the presence of the second timing circuit allows decoupling of the triggering time constant ($\tau_1$) and clamp engagement time constant ($\tau_2$). Consequently, the first time constant $\tau_1$ can be much lower than the case where a single timing circuit performs both functions, which typically is a few microseconds. This is because the first time constant $\tau_1$ only needs to be large enough to sense the fast transient of a discharge event and not for holding the main ESD device on for a much longer duration of time. This leads to a lower value of capacitance required for C1. A lower capacitor value directly translates to reduced semiconductor area requirement. A triggering time constant $\tau_1$ of about 30 ns suffices to detect ESD events while giving high immunity to false triggering. It is to be appreciated, however, that embodiments of the invention are not limited to any specific value of the triggering time constant.

In one or more embodiments, the second timing network 304, comprising resistor R2 and capacitor C2, which as previously stated represents the gate-to-source capacitance of the primary ESD element M1, preferably has a time constant $\tau_2$ which is greater than 1.5 μs, to ensure that the primary ESD element M1 is turned on for the duration of the ESD event. This time constant $\tau_2$ is a relatively large value that requires a correspondingly large RC product. However, embodiments of this invention utilize the inherent gate-to-source capacitance of the primary ESD element M1, which is large, commensurate with the required size of this device. Therefore, the need for a separate integrated capacitor (e.g., metal-insulator-metal (MIM) capacitor, etc.) is avoided. Since capacitor C2 is large, as necessitated by the size of the ESD element M1, resistor R2 can be made smaller. This leads to beneficial savings in IC layout area in realizing the second timing network 304.

In one or more embodiments, the third timing network 306 is configured to prevent undesirable operation of the ESD power clamp circuit 300 by disabling the clamping action. As used herein, the term "undesirable operation" is intended to refer to false triggering during a power-on condition and after power-on due to supply node corruption with spurious transients or with high-frequency signals. Specifically, the third timing network 306 is configured to exploit a characteristic decaying profile of an ESD pulse in order to distinguish ESD events from power-on events spanning about the same duration of time. In one or more embodiments, the time constant $\tau_3$ of the third timing network 306 is about 200 ns, which is many times higher than the time constant $\tau_1$ of the first timing network 302 and is considerably lower than the second time constant $\tau_2$ of the second timing network 304, as previously stated.

Distinguishability of legitimate ESD events can be described as follows. An ESD event is generally characterized by a sharp rise followed by exponential decay. Considering a human body model (HBM) pulse, an exemplary ESD event exhibits a rise time of under 10 ns and a decay time to 25 percent of its peak amplitude in less than about 200 ns. In contrast, a fast turn-on event, such as a power-on condition, has a rising profile. This implies that a timed circuit with a response time of about 200 ns is innocuous to an ESD event because the stimulus dies down before the timed circuit can produce a high output signal, whereas a non-discharge event does not die down within this time period. As a result, a non-discharge event initiates a response from the timed circuit after about 200 ns that can be used to disable clamping action during non-discharge events which do not follow a characteristic ESD event profile. The ESD power clamp circuit 300 utilizes this feature to achieve a sub-microsecond power-up time which is highly beneficial in certain applications.

The capacitance network 310 in the third timing circuit 306 which controls enablement of the clamping action (e.g., by controlling the activation of NMOS devices M3 and M4), in one or more embodiments, includes two series-connected capacitors C3 and C4 that function as a voltage divider. This voltage division serves to keep the gates of NMOS devices M3 and M4 at node N3 below a threshold voltage during an ESD event, which ensures that the enable circuit 308 does not get activated during ESD events up to a prescribed maximum rated intensity (e.g., about 4 kV HBM). The voltage divider helps to further improve the turn-on time of the power clamp circuit 300 when operating from a high-voltage rail.

The voltage regulator network 307 stabilizes the voltage driving the gates of enable devices M3 and M4 at steady-state after powering up. This is advantageous, at least in part, because capacitive voltage division in generally not stable over long durations of time, as asymmetry in dielectric leakage (or other factors) may eventually cause the voltage to drift towards either VDD or VSS. The regulator forces the voltage at node N3 to stabilize at the breakdown voltage of the Zener diode D1, which is about 5.8 volts (V). Thus, the voltage regulator network 307 is configured to limit a voltage output from the third timing network 306 that is coupled to the first voltage supply VDD to a level low enough to drive the enable circuit 308. One drawback of this approach is the current consumed by the voltage regulator network 307 in the powered-up state. This current consumption can be reduced to an arbitrarily low value by choice of resistors R3 and R4, a tradeoff being an increased area requirement. For example, if the sum of resistors R3 and R4 is about 1 megohms (MΩ), the on-state current will be about 6 μA, which is small but not necessarily negligible.

Figure 5:
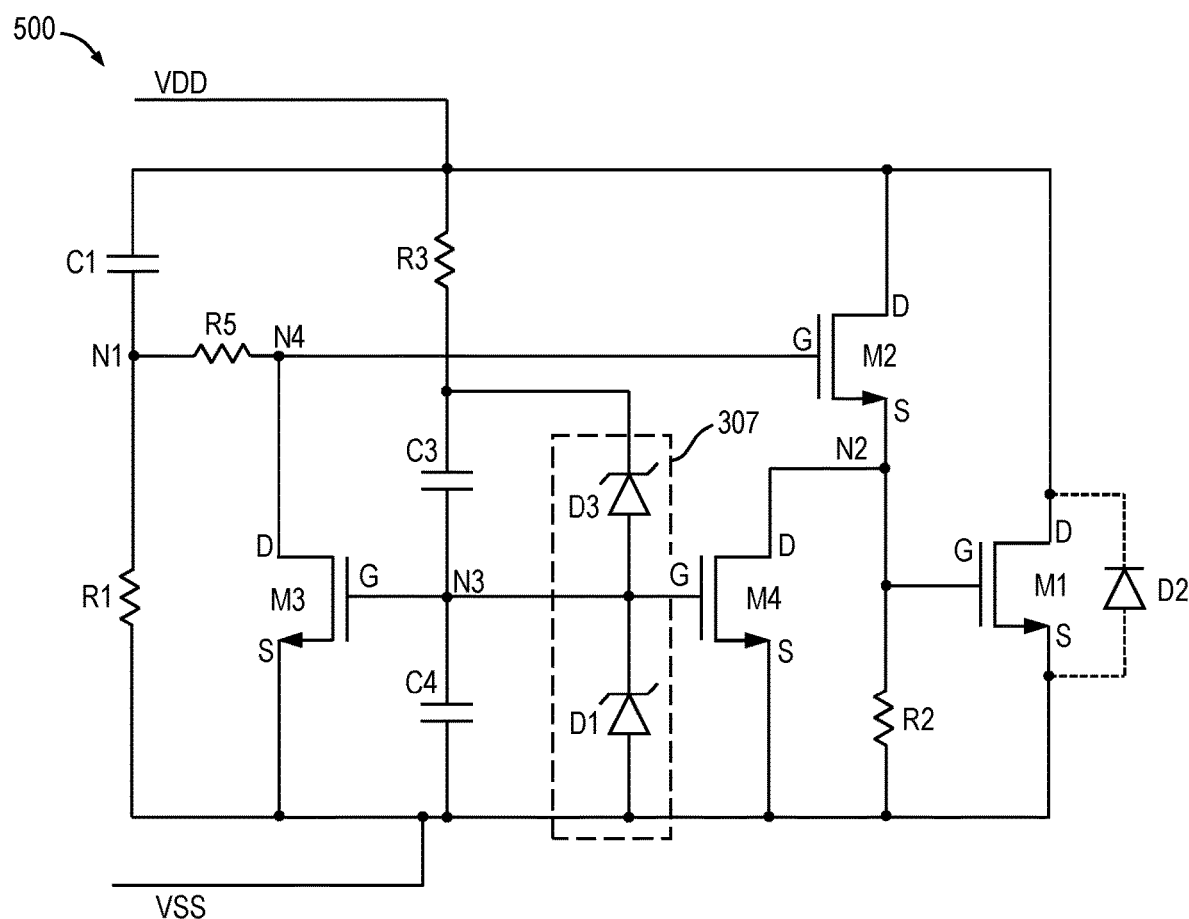
FIG. 5 is a schematic diagram depicting at least a portion of an illustrative transient ESD power clamp circuit for high-voltage RF integrated circuits, in accordance with an alternative embodiment of the present invention.

FIG. 5 is a schematic diagram depicting at least a portion of an illustrative transient ESD power clamp circuit 500 for high-voltage RF integrated circuits, in accordance with an alternative embodiment of the invention. Power clamp circuit 500 is essentially the same as exemplary power clamp circuit 300 shown in FIG. 3, except for the configuration of the voltage regulator network 307. Specifically, the resistor R4 shown in FIG. 3 is replaced by a reverse-biased high leakage diode D3 having a sufficiently high breakdown voltage. The combined breakdown voltage should exceed the maximum rated supply voltage to prevent the diode D3 from operating in the breakdown region. The high leakage from the diode D3 suffices to bias the voltage regulator 307 at a significantly lower current (e.g., about 0.1 μA). This alternative embodiment of the power clamp circuit 500 can significantly reduce on-state current consumption.

With continued reference to FIG. 3, as previously described, the power clamp enable circuit 308 is configured to disable the clamping action of the power clamp circuit 300 during normal operation of the IC device. Normal operation of the IC device is broadly defined herein as any manner of operation after powering up. Post power-up disabling functionality is desirable for some applications, such as, but not limited to, an RF power amplifier application. RF power amplifiers, under certain conditions of operation, can exhibit significant RF voltage swings at the supply nodes. Such conditions include, for example, operating the power amplifier close to saturation where power level is high, and impedance mismatch at an RF output terminal of the amplifier. This problem is exacerbated by the fact that on-chip bypass capacitance is usually low and trace inductance between external and internal bypassing capacitors is often non-negligible. Thus, there is the potential for high supply node RF swings which could otherwise interfere with and cause false activation of the power clamp. This is due, at least in part, to the fact that RF signal frequencies are higher than a corner frequency of the first timing circuit 302, which is essentially a high-pass filter. To mitigate this risk, the clamp enable circuit 308 and the third timing circuit are configured to disable the ESD power clamp circuit 300 after power-up. When disabled, the ESD power clamp circuit 300 presents a moderate capacitive impedance between the voltage supply terminals, as previously described.

By way of example only and without limitation or loss of generality, in one or more embodiments the time constant $\tau_1$ of the first timing network 302 is selected to be about 30 ns, which is small enough to ensure that only fast transients are detected. The time constant $\tau_2$ of the second timing network 304 is selected to be about 1.5 μs, which is longer than a duration of the ESD event (generally about 1 μs or less). The second timing network 304 is configured to keep the primary ESD element M1 active for a prescribed minimum amount of time, which ensures that the ESD current gets diverted through the ESD element for the entire duration of the ESD event.

The time constant $\tau_3$ of the third timing network 306 is selected to be about 200 ns—in between the time constants of the first and second timing networks—to help provide noise immunity by distinguishing an ESD event from other transients on the power supply nodes such as a fast power-up event. The third timing network 306 functions to disable the power clamp circuit after about 200 ns unless the detected transient exhibits a decaying profile, in which case the third timing circuit does not provide an output signal since the voltage transient has already decayed before it can turn on. Conversely, if the detected transient is a power-on event, the detected voltage continues to rise and reaches a high enough value so that the third timing network 306 does provide an output signal after t=200 ns. The power clamp circuit 300 is then disabled to prevent the primary ESD element from sinking current. In this manner, the ESD power clamp circuit 300 is beneficially capable of distinguishing ESD events from power-up transients and is configured to disable itself after a prescribed time to prevent malfunction and/or damage resulting from a false trigger.

It is to be appreciated that while certain exemplary time constant values are described herein above, embodiments of the invention are not limited to any particular time constants. Rather, embodiments of the invention contemplate various other time constants that can be used, depending on the circuit topology and application, as will become apparent to those skilled in the art given the teachings herein.

Figure 4:
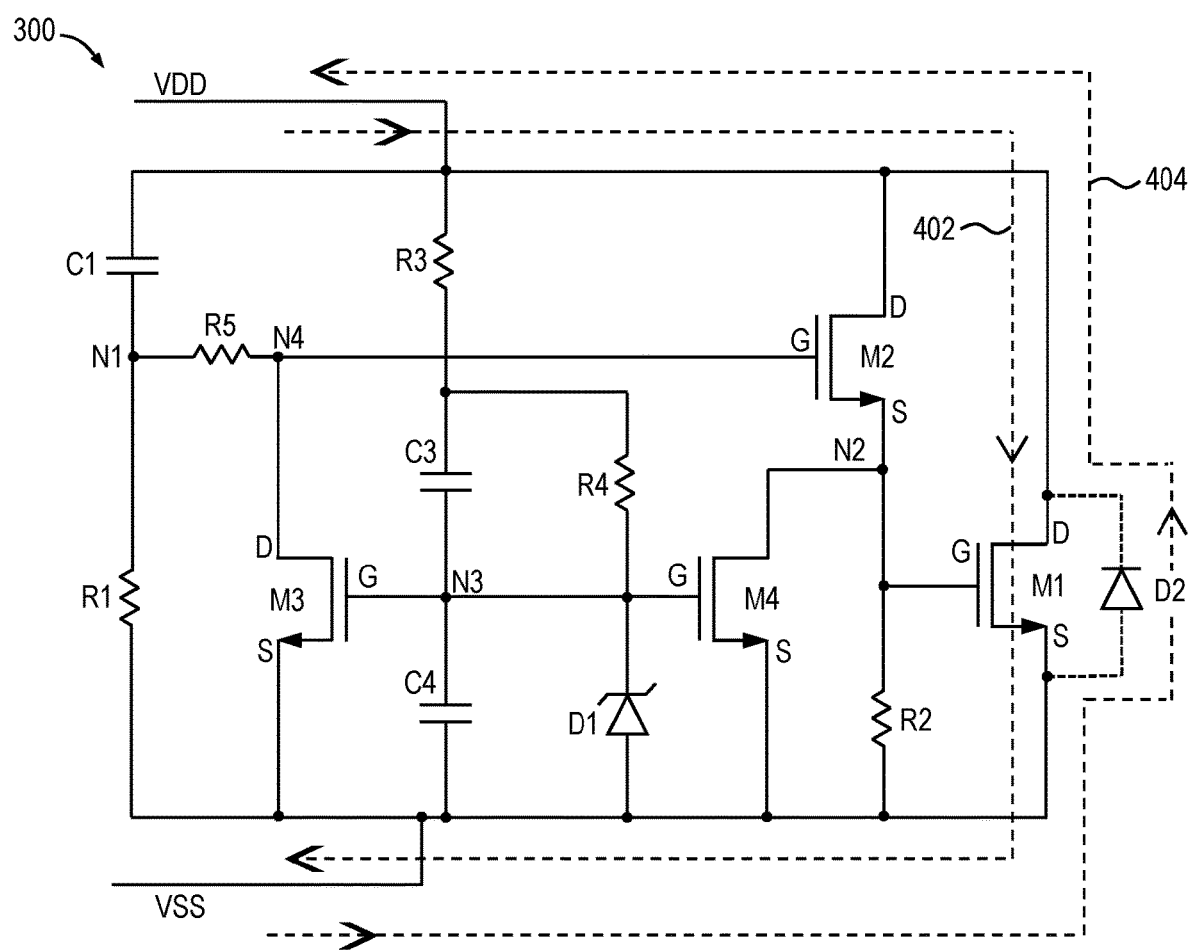
FIG. 4 is a schematic diagram depicting at least a portion of the illustrative transient ESD power clamp circuit shown in FIG. 3, including current discharge paths through the power clamp for positive and negative polarity ESD events, in accordance with an embodiment of the present invention.

FIG. 4 is a schematic diagram depicting at least a portion of the illustrative transient ESD power clamp circuit 300 shown in FIG. 3, including current discharge paths, 402 and

404, through the power clamp circuit for positive and negative polarity ESD events, respectively, in accordance with an embodiment of the invention. A positive going voltage transient on the positive supply node VDD will pull up node N1 through capacitor C1, thereby turning on the driver device M2, which causes the primary ESD element M1 to turn on completing the discharge path 402, provided the voltage transient exhibits a profile characterized by a fast rise time followed by an exponential decay to qualify the transient as an ESD event. Conversely, when the positive supply node VDD is at a lower potential than the negative supply node VSS, the intrinsic body diode D1 associated with the primary ESD element M1 turns on to provide the low impedance discharge path 404. In this manner, the ESD power clamp circuit 300 operates bidirectionally to limit the voltage rise across the positive and negative supply nodes, VDD and VSS, respectively.

Figure 6:
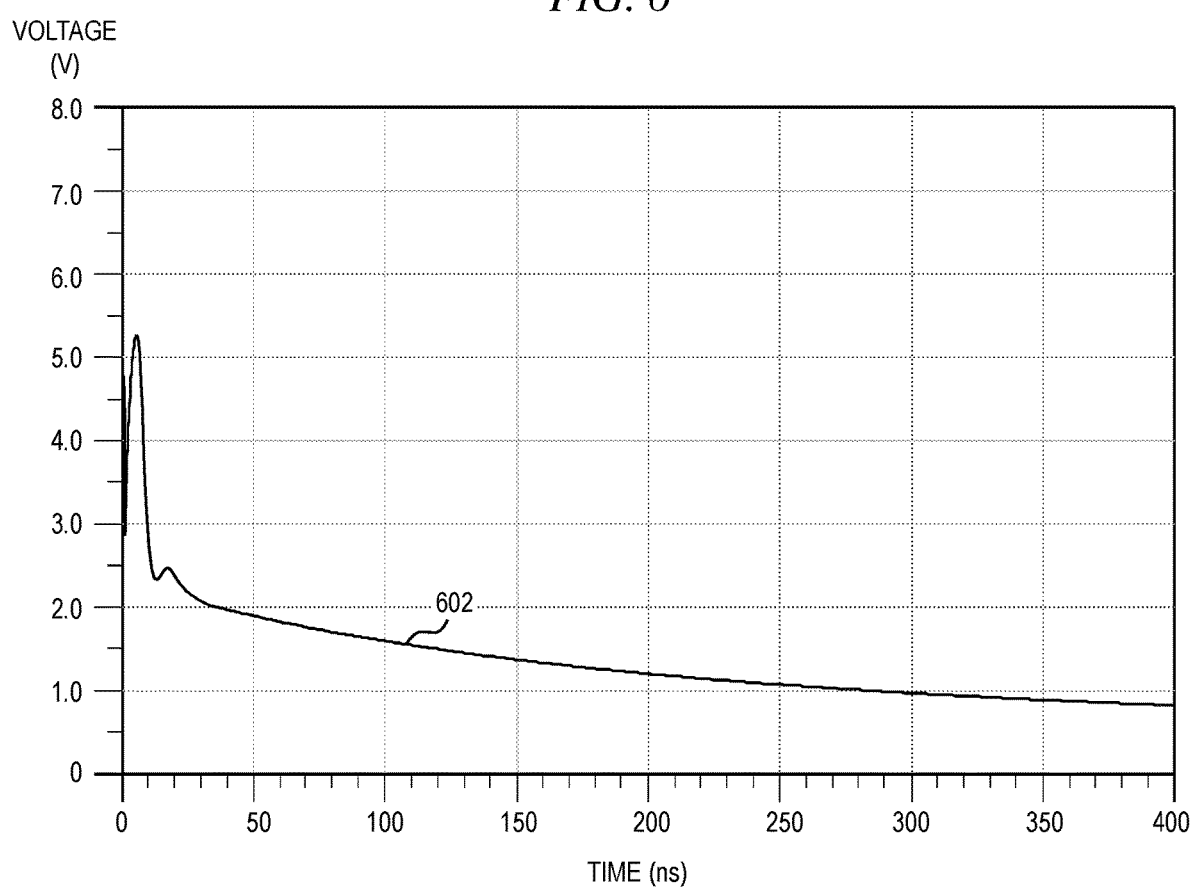
FIG. 6 graphically depicts simulated performance of the illustrative transient ESD power clamp circuit shown in FIG. 3 when subjected to a 2 kilovolt (kV) ESD event, in accordance with an embodiment of the present invention.

FIG. 6 graphically depicts simulated performance of the illustrative transient ESD power clamp circuit 300 shown in FIG. 3 when subjected to a 2 kilovolt (kV) ESD event, in accordance with an embodiment of the invention. Waveform 602 represents a voltage across positive and negative supply nodes VDD and VSS, respectively, as a function of time. By way of example only and without limitation, the ESD power clamp circuit 300 shown in FIG. 3 was simulated using the following exemplary component values: R1=15 kiloohms (kΩ), R2=500 kΩ, R3=600 kΩ, C1=2 picofarad (pF), C2=5 pF, C3=0.4 pF, C4=0.5 pF, R4=400 kΩ and R4=300Ω. It is to be appreciated, however, that embodiments of the invention are not limited to any particular set of values of the components. As apparent from FIG. 6, a peak of about 5.5 volts (V) occurring at about 6 ns is within a tolerable limit of gate oxide voltage stress for NMOS devices.

Figure 7:
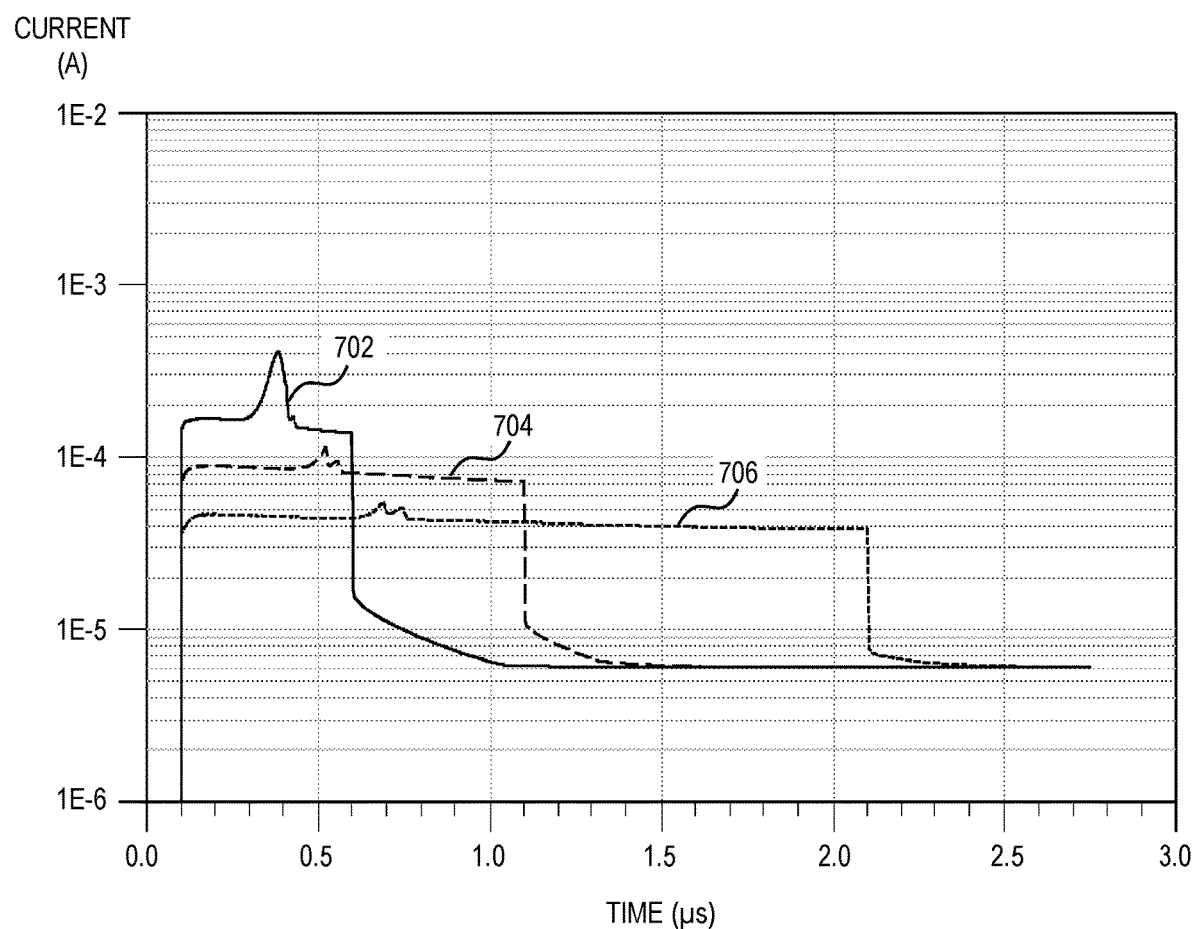
FIG. 7 graphically depicts simulated performance results of clamp current as a function of time during a power-up event for the illustrative transient ESD power clamp circuit shown in FIG. 3, in accordance with an embodiment of the present invention.

FIG. 7 graphically depicts simulated performance results of clamp current as a function of time during a power-up event for the illustrative transient ESD power clamp circuit 300 shown in FIG. 3, in accordance with an embodiment of the invention. The three waveforms correspond to different supply voltage turn-on times. Specifically, waveform 702 represents a 500-ns turn-on time, waveform 704 represents a 1-μs turn-on time, and waveform 706 represents a 2-μs turn-on time. As apparent from FIG. 7, the peak current through the primary ESD element M1 for a 500 ns turn-on event (waveform 702) is about 407 microamperes (μA). Peak current is about 114 μA for a 1-μs turn-on event (waveform 704), and it drops further to under about 55 μA for a 2-μs turn-on event (waveform 706).

Figure 8:
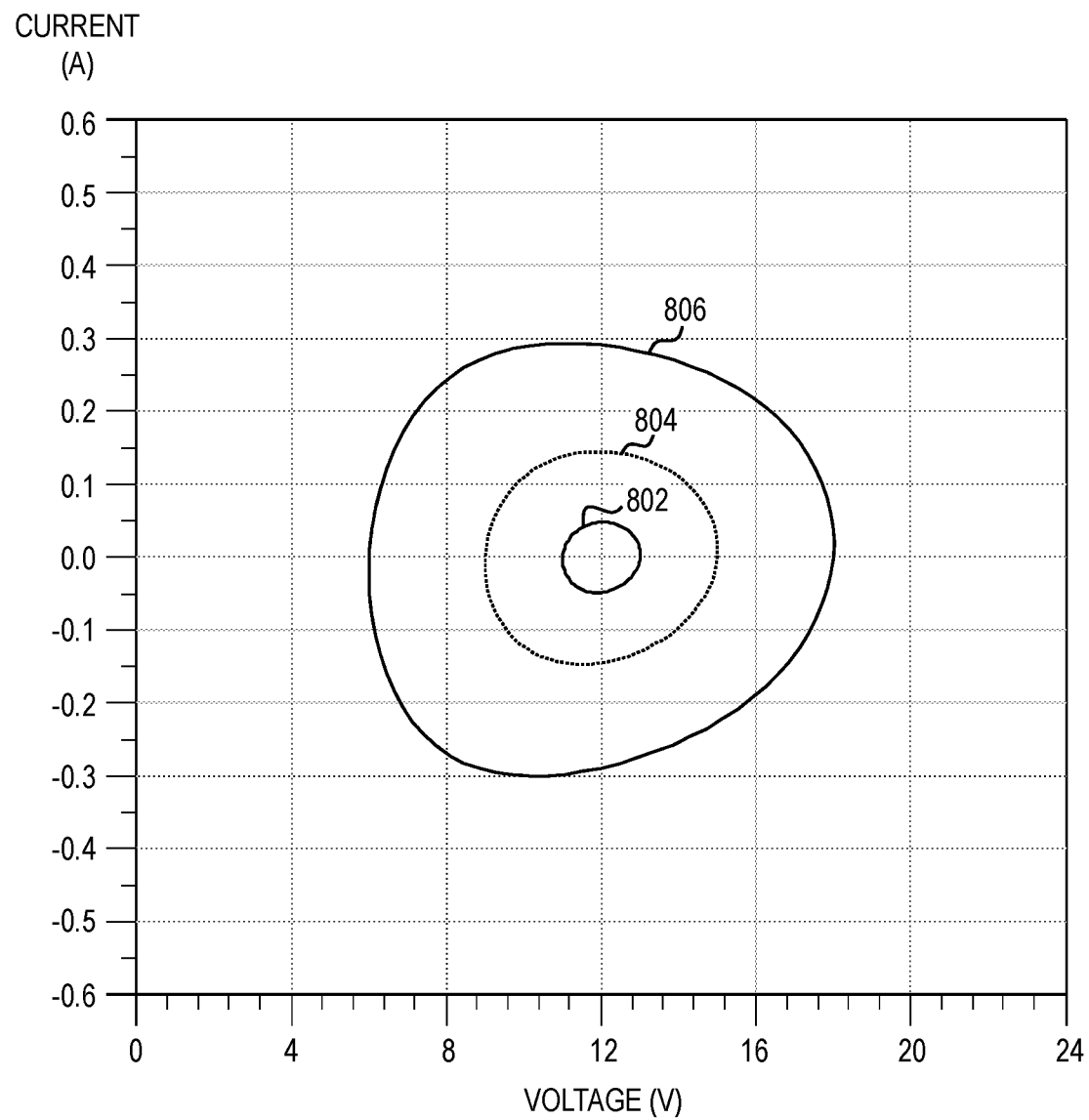
FIG. 8 graphically depicts a simulated current-voltage trajectory plot for the illustrative transient ESD power clamp circuit shown in FIG. 3, with the circuit in a disabled state and under supply node RF signal interference, in accordance with an embodiment of the present invention.

The power clamp circuit design according to one or more embodiments of the invention is highly insensitive to high-frequency signal interference. By way of example only and without limitation, FIG. 8 graphically depicts simulated current-voltage trajectory plots for the illustrative transient ESD power clamp circuit 300 shown in FIG. 3, with the circuit in a powered-up state and under supply node RF signal interference, according to an embodiment of the invention. Specifically, for this example the power clamp circuit 300 is assumed to be in a powered-up state with 2.45 gigahertz (GHz) RF signal coupling into the positive supply node (VDD). Plot 802 illustrates the effect of 1.0 volt of RF voltage swing while operating from a 12-volt DC supply, plot 804 illustrates the effect of 3.0 volts of RF voltage swing, and plot 806 shows the effect of 6.0 volts of RF voltage swing. As will become apparent to those skilled in the art, a circular pattern is indicative of a purely reactive impedance. The near circular pattern under as much as 6.0 volts of RF voltage swing indicates that the main ESD element M1 and driver device M2 remain in an off state, and thus demonstrates the high level of immunity of the power clamp circuit 300 to false activation under high-frequency signal coupling.

Given the discussion thus far, it will be appreciated that an exemplary power clamp circuit suitable for use in an ESD protection application includes at least first, second and third independent timing networks, first and second NMOS transistors and an enable circuit. The first timing network is connected between first and second voltage supply nodes and has a first time constant associated therewith, the first timing network being configured to detect a voltage transient between the first and second voltage supply nodes having a rise time less than or equal to a value of the first time constant. The first NMOS transistor has a gate operatively coupled with an output of the first timing network and a source connected with a gate of the second NMOS transistor in a source follower configuration. The second NMOS transistor has a drain connected with the first voltage supply node and a source connected with the second voltage supply node. The second timing network is coupled with the gate of the second NMOS transistor, the second timing network having a second time constant associated therewith that is greater than an anticipated duration of the ESD event. The enable circuit is coupled with the first and/or second NMOS transistors and is configured to selectively inhibit clamping action of the power clamp circuit as a function of a first control signal supplied to the enable circuit. The third timing network is coupled with the enable circuit and has a third time constant associated therewith, the third timing network being configured to generate the first control signal as a function of the third time constant.

Given the discussion thus far, it will also be appreciated that an integrated circuit includes at least one transient power clamp circuit operatively coupled with core circuitry to be protected from an ESD event. The transient power clamp circuit includes a first timing network connected between first and second voltage supply nodes, the first timing network having a first time constant associated therewith and being configured to detect a voltage transient between the first and second voltage supply nodes that has a rise time less than or equal to a value of the first time constant. The power clamp circuit further includes at least first and second NMOS transistors, the first NMOS transistor having a gate operatively coupled with an output of the first timing network and having a source connected with a gate of the second NMOS transistor in a source follower configuration, the second NMOS transistor having a drain connected with the first voltage supply node and a source connected with the second voltage supply node. A second timing network in the power clamp circuit is coupled with the gate of the second NMOS transistor, the second timing network having a second time constant associated therewith that is greater than an anticipated duration of the ESD event. An enable circuit in the power clamp circuit is operatively coupled with at least one of the first and second NMOS transistors, the enable circuit being configured to selectively inhibit clamping action of the power clamp circuit as a function of a first control signal supplied to the enable circuit. The power clamp circuit further includes a third timing network coupled with the enable circuit, the third timing network having a third time constant associated therewith and being configured to generate the first control signal as a function of the third time constant.

At least a portion of the techniques of the present invention may be implemented in an integrated circuit. In forming integrated circuits, identical dies are typically fabricated in a repeated pattern on a surface of a semiconductor wafer.

Each die includes a device described herein and may include other structures and/or circuits. The individual dies are cut or diced from the wafer (e.g., as part of a singulation process), then packaged as an integrated circuit. One skilled in the art would know how to dice wafers and package dies to produce integrated circuits. Any of the exemplary circuits illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from ESD protection, in accordance with one or more embodiments of the invention.

An integrated circuit in accordance with aspects of the present disclosure can be employed in essentially any application and/or electronic system where protection from ESD events is desired. An integrated circuit including at least one ESD power clamp architecture according to one or more embodiments of the invention can be used to support fast powering-up at least in part by distinguishing ESD events from spurious transients on the voltage supply rails spanning similar durations of time. This is accomplished, in one or more embodiments, by utilizing at least three independent timing networks configured to advantageously exploit the nature of ESD events that are characterized by a fast rise followed by an exponential decay. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose could be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "upper," "lower," "front" and "back," where used, are intended to indicate relative positioning of elements or structures to each other when such elements are oriented in a particular manner, as opposed to defining absolute positioning of the elements.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus, the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A transient power clamp circuit for protecting core circuitry in an integrated circuit device from damage attributable to an electrostatic discharge (ESD) event, the power clamp circuit comprising:
    a first timing network connected between first and second voltage supply nodes, the first timing network having a first time constant associated therewith and being configured to detect a voltage transient between the first and second voltage supply nodes that has a rise time less than or equal to a value of the first time constant;
    first and second N-channel metal-oxide-semiconductor (NMOS) transistors, the first NMOS transistor having a gate operatively coupled with an output of the first timing network and having a source connected with a gate of the second NMOS transistor in a source follower configuration, the second NMOS transistor having a drain connected with the first voltage supply node and a source connected with the second voltage supply node;

a second timing network coupled with the gate of the second NMOS transistor, the second timing network having a second time constant associated therewith that is greater than an anticipated duration of the ESD event;

an enable circuit operatively coupled with at least one of the first and second NMOS transistors, the enable circuit being configured to selectively inhibit clamping action of the power clamp circuit as a function of a first control signal supplied to the enable circuit; and a third timing network coupled with the enable circuit, the third timing network having a third time constant associated therewith and being configured to generate the first control signal as a function of the third time constant.

2. The power clamp circuit of claim 1, further comprising a voltage regulator network coupled with the third timing network, the voltage regulator network being configured to limit a voltage output from the third timing network that is coupled to the first voltage supply node to a level low enough to drive the enable circuit.

3. The power clamp circuit of claim 2, wherein the voltage regulator network comprises a Zener diode having a cathode connected with an output of the third timing network and an anode connected with the second voltage supply node.

4. The power clamp circuit of claim 3, wherein the voltage regulator network comprises a reverse-biased diode having an anode connected with the cathode of the Zener diode and a cathode connected with an intermediate node in the third timing network.

5. The power clamp circuit of claim 3, wherein the voltage regulator network comprises a resistor connected between the cathode of the Zener diode and an intermediate node in the third timing network.

6. The power clamp circuit of claim 1, wherein the first timing network comprises a resistor-capacitor circuit including a first resistor connected between the output of the first timing network and the second voltage supply node, and a first capacitor connected between the first voltage supply node and the output of the first timing network, the first time constant being controlled as a function of at least one of a resistance of the first resistor and a capacitance of the first capacitor.

7. The power clamp circuit of claim 1, wherein the second timing network comprises a second resistor connected between the gate of the second NMOS transistor and the second voltage supply node, the second time constant being controlled as a function of at least one of a resistance of the second resistor and a gate-to-source capacitance of the second NMOS transistor.

8. The power clamp circuit of claim 1, wherein the third timing network comprises a voltage divider network and a third resistor connected with the voltage divider network, the voltage divider network including third and fourth capacitors, a first terminal of the third capacitor being connected to a first terminal of the third resistor, and second terminal of the third capacitor being connected to a first terminal of the fourth capacitor, a second terminal of the fourth capacitor being connected with the second voltage supply node, and a second terminal of the third resistor being connected with the first voltage supply node, the third time constant being controlled as a function of at least one of a resistance of the third resistor and respective capacitances of the third and fourth capacitors.

9. The power clamp circuit of the claim 1, wherein the enable circuit comprises at least a third NMOS transistor having a drain connected with one of the gate of the first NMOS transistor and the gate of the second NMOS transistor, a source connected with the second voltage supply node, and a gate connected with an output of the third timing network.

10. The power clamp circuit of the claim 1, wherein the enable circuit comprises at least third and fourth NMOS transistors, the third NMOS transistor having a drain connected with the gate of the first NMOS transistor, a source connected with the second voltage supply node and a gate connected with an output of the third timing network, and the fourth NMOS transistor having a drain connected with the gate of the second NMOS transistor, a source connected with the second voltage supply node and a gate connected with the output of the third timing network.

11. The power clamp circuit of claim 1, wherein the second NMOS transistor comprises an intrinsic body diode having a cathode connected with the first voltage supply node and an anode connected with the second voltage supply node, the intrinsic body diode turning on and providing a current discharge path when a voltage on the second voltage supply node is greater than a voltage on the first voltage supply node.

12. The power clamp circuit of claim 1, wherein the first time constant is selected to be substantially smaller than the second time constant, and the third time constant is selected to be less than the second time constant and substantially greater than the first time constant.

13. The power clamp circuit of claim 1, wherein each of the first, second and third timing networks are decoupled from one another, such that the time constant of a given one of the first, second and third timing networks is not a function of the other timing networks in the power clamp circuit.

14. The power clamp circuit of claim 1, further comprising a current limiting resistor connected in series between the gate of the first NMOS transistor and the output of the first timing network.

15. An integrated circuit, comprising:
core circuitry to be protected from an electrostatic discharge (ESD) event; and
at least one transient power clamp circuit adapted to protect the core circuitry from damage attributable to the ESD event, the at least one transient power clamp circuit comprising:
a first timing network connected between first and second voltage supply nodes, the first timing network having a first time constant associated therewith and being configured to detect a voltage transient between the first and second voltage supply nodes that has a rise time less than or equal to a value of the first time constant;
first and second N-channel metal-oxide-semiconductor (NMOS) transistors, the first NMOS transistor having a gate operatively coupled with an output of the first timing network and having a source connected with a gate of the second NMOS transistor in a source follower configuration, the second NMOS transistor having a drain connected with the first voltage supply node and a source connected with the second voltage supply node;

a second timing network coupled with the gate of the second NMOS transistor, the second timing network having a second time constant associated therewith that is greater than an anticipated duration of the ESD event;

an enable circuit operatively coupled with at least one of the first and second NMOS transistors, the enable circuit being configured to selectively inhibit clamping action of the power clamp circuit as a function of a first control signal supplied to the enable circuit; and a third timing network coupled with the enable circuit, the third timing network having a third time constant associated therewith and being configured to generate the first control signal as a function of the third time constant.

16. The integrated circuit of claim 15, wherein the transient power clamp circuit further comprises a voltage regulator network coupled with the third timing network, the voltage regulator network being configured to limit a voltage output from the third timing network that is coupled to the first voltage supply node to a level low enough to drive the enable circuit.

17. The integrated circuit of claim 16, wherein the voltage regulator network comprises:

a Zener diode having a cathode connected with an output of the third timing network and an anode connected with the second voltage supply node; and one of a reverse-biased diode and a resistor, the reverse-biased diode having an anode connected with the cathode of the Zener diode and a cathode connected with an intermediate node in the third timing network, the resistor connected between the cathode of the Zener diode and the intermediate node in the third timing network.

18. The integrated circuit of claim 15, wherein the first timing network in the transient power clamp circuit comprises a resistor-capacitor circuit including a first resistor connected between the output of the first timing network and the second voltage supply node, and a first capacitor connected between the first voltage supply node and the output of the first timing network, the first time constant being controlled as a function of at least one of a resistance of the first resistor and a capacitance of the first capacitor.

19. The integrated circuit of claim 15, wherein the second timing network in the transient power clamp circuit comprises a second resistor connected between the gate of the second NMOS transistor and the second voltage supply node, the second time constant being controlled as a function of at least one of a resistance of the second resistor and a gate-to-source capacitance of the second NMOS transistor.

20. The integrated circuit of claim 15, wherein the third timing network in the transient power clamp circuit comprises a voltage divider network and a third resistor connected with the voltage divider network, the voltage divider network including third and fourth capacitors, a first terminal of the third capacitor being connected to a first terminal of the third resistor, and second terminal of the third capacitor being connected to a first terminal of the fourth capacitor, a second terminal of the fourth capacitor being connected with the second voltage supply node, and a second terminal of the third resistor being connected with the first voltage supply node, the third time constant being controlled as a function of at least one of a resistance of the third resistor and respective capacitances of the third and fourth capacitors.

21. The integrated circuit of claim 15, wherein the enable circuit in the transient power clamp circuit comprises at least a third NMOS transistor having a drain connected with one of the gate of the first NMOS transistor and the gate of the second NMOS transistor, a source connected with the second voltage supply node, and a gate connected with an output of the third timing network.

22. The integrated circuit of claim 15, wherein the enable circuit in the transient power clamp circuit comprises at least third and fourth NMOS transistors, the third NMOS transistor having a drain connected with the gate of the first NMOS transistor, a source connected with the second voltage supply node and a gate connected with an output of the third timing network, and the fourth NMOS transistor having a drain connected with the gate of the second NMOS transistor, a source connected with the second voltage supply node and a gate connected with the output of the third timing network.

23. The integrated circuit of claim 15, wherein the second NMOS transistor in the transient power clamp circuit comprises an intrinsic body diode having a cathode connected with the first voltage supply node and an anode connected with the second voltage supply node, the intrinsic body diode turning on and providing a current discharge path when a voltage on the second voltage supply node is greater than a voltage on the first voltage supply node.

24. The integrated circuit of claim 15, wherein each of the first, second and third timing networks in the transient power clamp circuit are decoupled from one another, such that the time constant of a given one of the first, second and third timing networks is not a function of the other timing networks in the power clamp circuit.

25. The integrated circuit of claim 15, wherein the transient power clamp circuit further comprises a current limiting resistor connected in series between the gate of the first NMOS transistor and the output of the first timing network.

* * * * *